United States Patent
Nakanishi

(10) Patent No.: US 10,959,361 B2
(45) Date of Patent: Mar. 23, 2021

(54) SUBSTRATE WORKING MACHINE

(71) Applicant: FUJI CORPORATION, Chiryu (JP)

(72) Inventor: Yusuke Nakanishi, Chiryu (JP)

(73) Assignee: FUJI CORPORATION, Chiryu (JP)

(*) Notice: Subject to any disclaimer, the term of this patent is extended or adjusted under 35 U.S.C. 154(b) by 252 days.

(21) Appl. No.: 16/322,138

(22) PCT Filed: Aug. 11, 2016

(86) PCT No.: PCT/JP2016/073683
§ 371 (c)(1),
(2) Date: Jan. 31, 2019

(87) PCT Pub. No.: WO2018/029844
PCT Pub. Date: Feb. 15, 2018

(65) Prior Publication Data
US 2019/0191605 A1    Jun. 20, 2019

(51) Int. Cl.
*B23P 19/00*    (2006.01)
*H05K 13/04*    (2006.01)
*H05K 13/08*    (2006.01)

(52) U.S. Cl.
CPC ....... *H05K 13/0473* (2013.01); *H05K 13/089* (2018.08); *H05K 13/0815* (2018.08); *Y10T 29/53174* (2015.01)

(58) Field of Classification Search
USPC ...... 29/739, 564.8, 566, 740, 741, 745, 825, 29/832
See application file for complete search history.

(56) References Cited

U.S. PATENT DOCUMENTS 6,609,295 B1* 8/2003 Koyama ............ H05K 13/0473
29/832
10,820,460 B2* 10/2020 Ishikawa ............ H05K 13/0473

FOREIGN PATENT DOCUMENTS

JP    1-109000 U    7/1989

OTHER PUBLICATIONS

International Search Report dated Oct. 4, 2016 in PCT/JP2016/073683 filed on Aug. 11, 2016.

* cited by examiner

*Primary Examiner* — Thiem D Phan
(74) *Attorney, Agent, or Firm* — Oblon, McClelland, Maier & Neustadt, L.L.P.

(57) ABSTRACT

Movable section of a cut and clinch unit includes exchange section in which is formed second insertion hole for cutting and bending a lead, and main body section to which exchange section is removably attached. An opening position of the second insertion hole is calculated as an attachment position of the exchange section on the main body section based on image data. It is determined whether a difference between the calculated opening position and a standard position of the second insertion hole that is set in advance exceeds a threshold value. If the difference between the calculated opening position and the standard position exceeds the threshold value, calibration is performed based on the assumption that the exchange section has been exchanged.

6 Claims, 10 Drawing Sheets

SUBSTRATE WORKING MACHINE

TECHNICAL FIELD

The present application relates to a substrate working machine provided with a bending device configured to bend a lead of a leaded component inserted into a through-hole formed in a board.

BACKGROUND ART

There are substrate working machines that mount a leaded component onto a board by inserting a lead of a leaded component into a through-hole formed in a board and using a specified member to bend the lead. An example of this type of substrate working machine is disclosed in the patent literature below.
Patent literature 1: JP-A-H1-109000

BRIEF SUMMARY

Technical Problem

Because the lead is bent by the specified member, it is necessary to appropriately match the specified member and the lead. Therefore, it is necessary to recognize the position of the specified member and perform calibration related to the position of the specified member. However, performing calibration often may lead to a decrease in productivity. The present disclosure takes account of such circumstances and an object thereof is to provide a substrate working machine capable of performing calibration while not decreasing productivity.

Solution to Problem

To solve the above problems, a substrate working machine of the present disclosure includes: a bending device configured to bend a lead of a leaded component inserted into a through-hole formed in a board; an imaging device; and a control device, wherein the bending device includes a contacting section configured to bend the lead via contact with the lead, and a main body section to which the contacting section is removably attached, and the control device includes an imaging section configured to use the imaging device to capture an image of a predetermined imaging target of the contacting section, a calculating section configured to calculate position information that is information related to an attachment position of the contacting section on the main body section based on imaging data captured by the imaging section, and a calibration performing section configured to perform calibration related to the attachment position of the contacting section to the main body section in a case in which a difference between position information calculated by the calculating section and set position information that is set in advance exceeds a threshold value.

Advantageous Effects

A substrate working device of the present disclosure is provided with a bending device configured from a contacting section for bending a lead by contacting the lead, and a main body section to which the contacting section is removably attached. With the substrate working machine, position information related to the attachment position of the contacting section on the main body section is calculated based on image data of the contacting section. Further, it is determined whether a difference between the calculated position information and set position information that is set in advance exceeds a threshold value. Here, if the difference between the calculated position information and the set position information exceeds the threshold value, calibration is performed based on the assumption that the contacting section has been removed from and attached to the main body section. That is, calibration is performed when there is a possibility of a deviation in the attachment position of the contacting section on the main body section due to the contacting section having been removed from and attached to the main body section. Accordingly, unnecessary performing of calibration is prevented, allowing calibration to be performed without a decrease in productivity.

DESCRIPTION OF PREFERRED EMBODIMENTS

Figure 1:
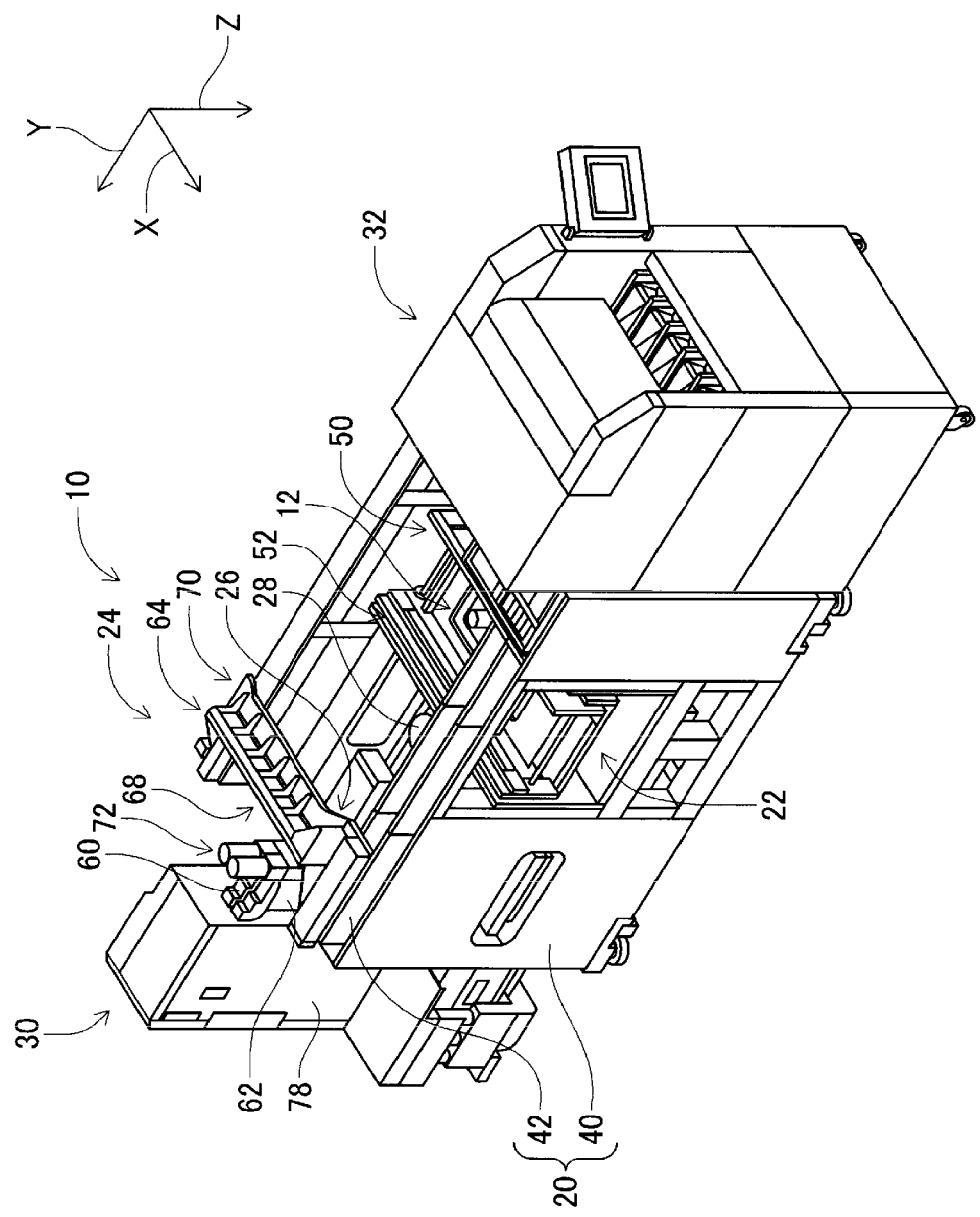
FIG. 1 is a perspective view of a component mounter.

The following describes in detail referring to the figures an example embodiment of the present disclosure.
Configuration of Component Mounter
FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device 34 (refer to FIG. 3), and control device 36 (refer to FIG. 8). Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
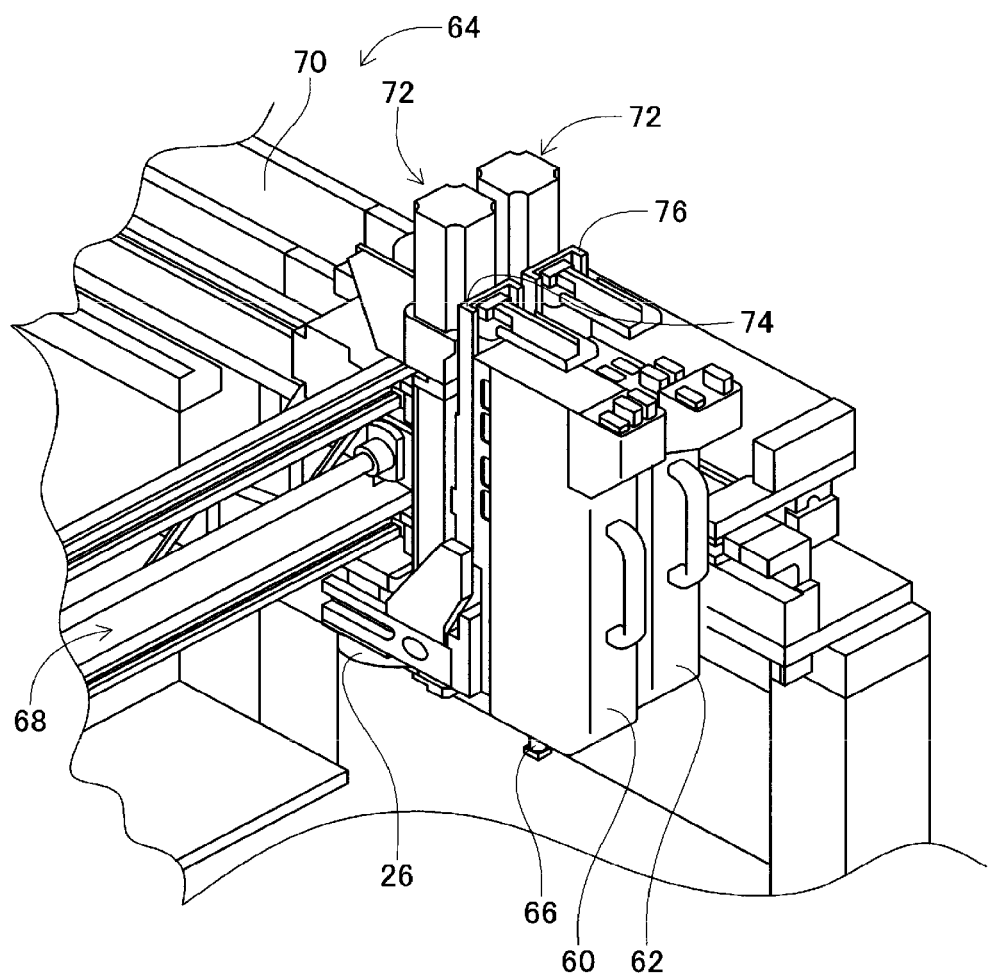
FIG. 2 is a perspective view of a component mounting device.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 8) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Note that, components supplied by component supply device 30 and loose component supply device 32 may include electronic circuit components, configuration components of solar panels, configuration components of power modules, and the like. Also, electronic circuit components include components with leads and components without leads.

Figure 3:
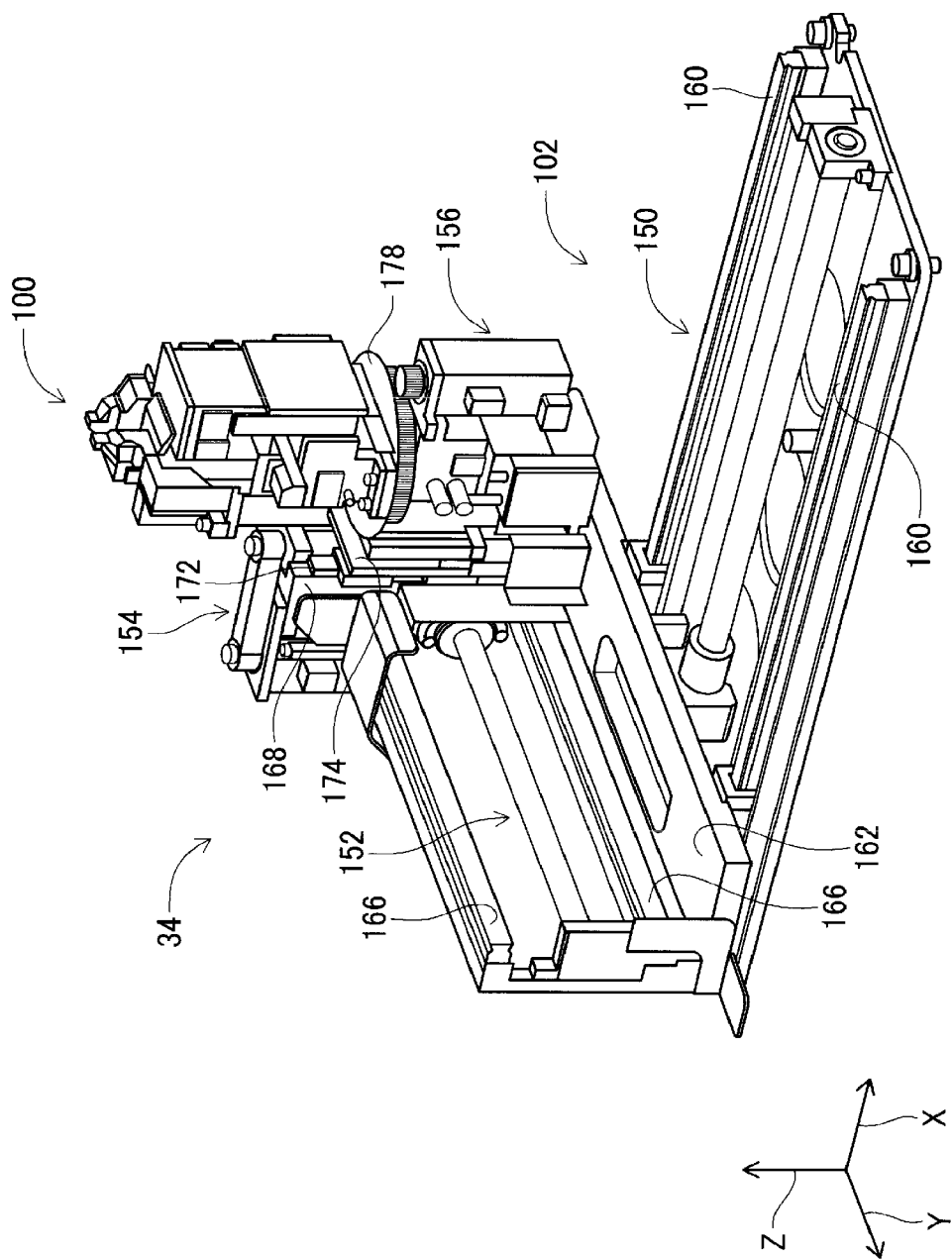
FIG. 3 is a perspective view of a cut and clinch device.
Figure 4:
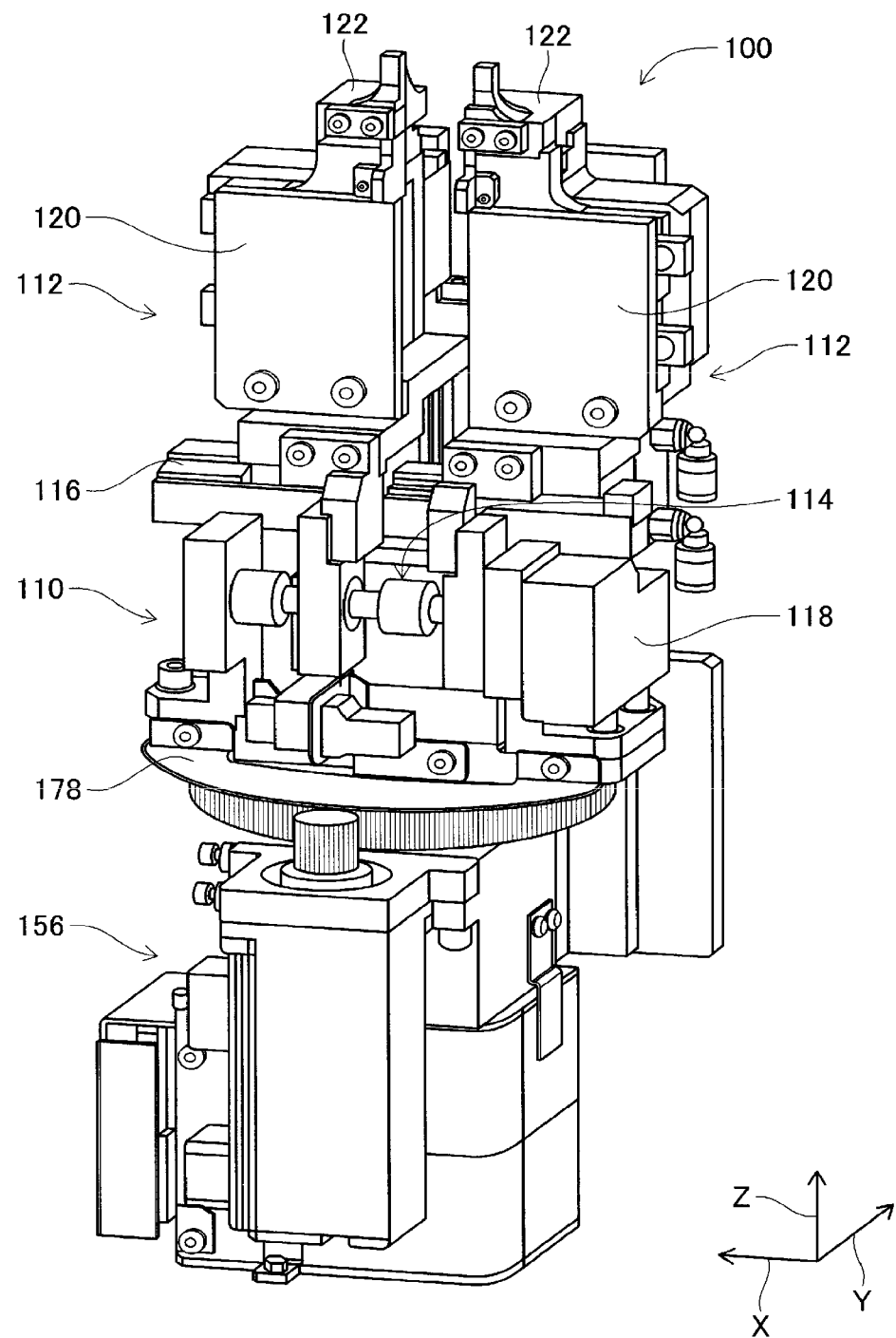
FIG. 4 is a perspective view of a cut and clinch unit.

Cut and clinch device 34 is arranged below conveyance device 50 and, as shown in FIG. 3, includes cut and clinch unit 100 and unit moving device 102. Cut and clinch unit 100 cuts and bends leads 108 (refer to FIG. 9) of leaded component 106 (refer to FIG. 9) inserted into through-holes 104 (refer to FIG. 9) formed in circuit board 12. As shown in FIG. 4, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. Also, pitch changing mechanism 114 includes electromagnetic motor 118, and the distance between the pair of slide bodies 112 can be controllably changed by operation of electromagnetic motor 118.

Figure 5:
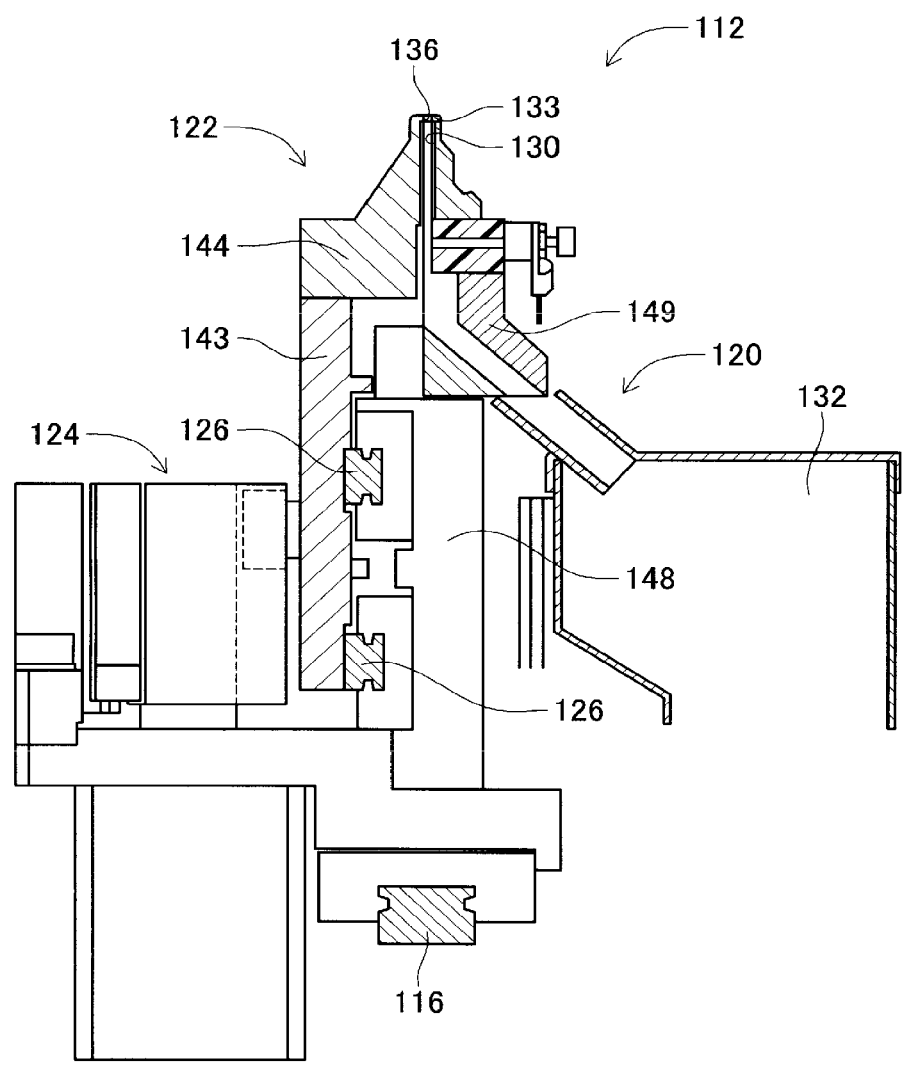
FIG. 5 is a cross section of a slide body.

Also, as shown in FIG. 5, each of the pair of slide bodies 112 includes fixed body section 120, movable section 122, and slide device 124, and is supported at fixed body section 120 so as to be slidable on slide rail 116. Two slide rails 126 are fixed to the rear side of fixed body section 120 extending in the X direction, and movable section 122 is slidably supported by those two slide rails 126. Also, slide device 124 includes electromagnetic motor (refer to FIG. 8) 128, and movable section 122 is controllably slid by operation of electromagnetic motor 128.

Also, the upper end section of fixed body section 120 is formed tapered towards the end, and first insertion hole 130 is formed so as to pierce the upper end section in a vertical direction. First insertion hole 130 is open at an upper end to an upper end surface of fixed section 120, and is open at a lower end to a side surface of fixed section 120. Note that, the edge of first insertion hole 130 that opens to the upper end surface of fixed section 120 is formed as fixed blade 131 (refer to FIG. 9). Also, below where first insertion hole 130 opens to a side surface of fixed section 120, discard box 132 is provided.

Figure 6:
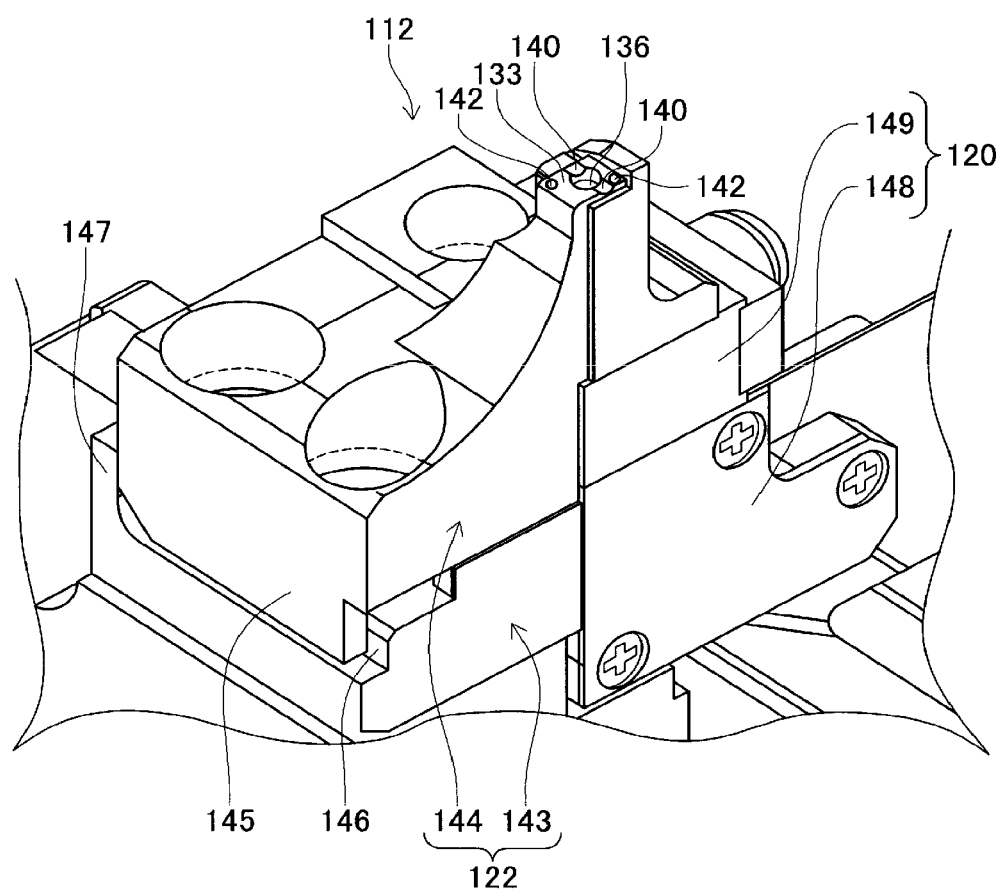
FIG. 6 is an enlarged view of the slide body.

Further, as shown in FIG. 6, an upper end section of movable section 122 is also formed tapered towards the end, and L-shaped curved section 133 is formed at the upper end section of movable section 122. Curved section 133 extends upwards of the upper end surface of fixed section 120, and there is slight clearance between curved section 133 and the upper end of main body section 120. And, first insertion hole 130 that opens at the upper end surface of fixed section 120 is covered by curved section 133, and second insertion hole 136 is formed in curved section 133 so as to face first insertion hole 130.

Second insertion hole 136 pierces through curved section 133 in a vertical direction, and an internal surface of second insertion hole 136 is a tapered surface configured with a diameter that gets smaller going down. On the other hand, the internal surface of first insertion hole 130 approaching the opening to the upper end surface of fixed section 120 is not a tapered surface, the internal surface of insertion hole 130 approaching the opening has an approximately regular diameter. Also, the edge of second insertion hole 136 that opens to the lower end surface of curved section 133 is formed as movable blade 138 (refer to FIG. 9).

Further, guide groove 140 is formed in the upper end surface of curved section 133 extending in the X-axis direction, that is, the sliding direction of movable section 122. Guide groove 140 is formed to straddle the opening of second insertion hole 136, and guide groove 140 and second insertion hole 136 are linked. Also, guide groove 140 is open at both side surfaces of curved section 133. Further, pair of marks 142 are provided on an upper end surface of curved section 133. The pair of marks 142 are provided centered around the center of the opening of second insertion hole 136. That is, the center point of the pair of marks 142 is the center of the opening of second insertion hole 136.

Figure 7:
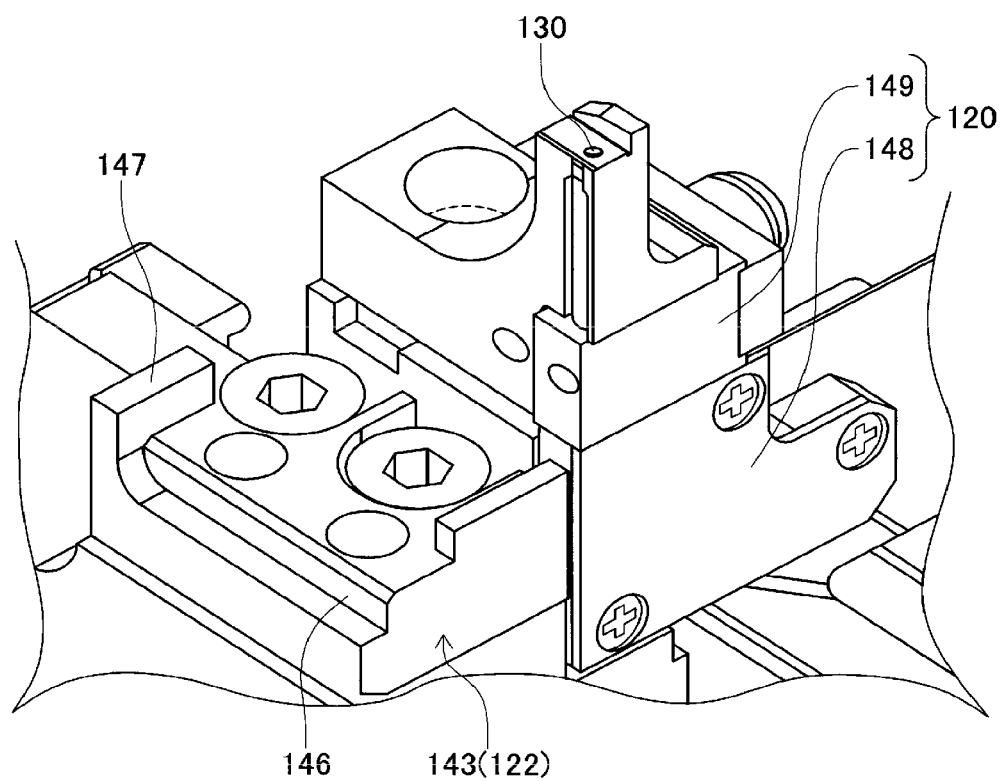
FIG. 7 is an enlarged view of a slide body in a state with an exchange section removed from a movable section.

Also, movable section 122 is configured from main body section 143 and exchange section 144. Main body section 143 configures a lower side portion of movable section 122, and as shown in FIG. 5, is slidably supported by slide rail 126. On the other hand, exchange section 144 configures an upper side portion of movable section 122, and includes curved section 133. Exchange section 144 and main body section 143 are connected by bolts, and as shown in FIG. 7, it is possible to remove exchange section 144 from main body section 143 by removing the bolts. That is, exchange section 144 is removably attached to main body section 143. Note that, multiple types of exchange sections 144 are prepared for second insertion holes 136 with different sized diameters, and an appropriate exchange section 144 is attached to main body 143 in accordance with the lead diameter of the leaded component 106 that is the work target.

When exchange section 144 is attached to main body section 143, exchange section 144 is attached to main body section 143 by bolts with a specified wall surface of exchange section 144 contacting a specified wall surface of main body section 143. In detail, as shown in FIG. 6, plate-type protruding section 145 that protrudes downwards is formed on an edge of the bottom surface of exchange section 144, and protruding section 145 extends in the X direction. Also, level difference section 146 and upright section 147 are formed on the edge of an upper surface of main body section 143, with level difference section 146 extending in the X direction and upright section 147 extending in the Y direction. As well as a side wall surface of protruding section 145 pressing against a side wall surface of level difference section 146, a side surface of exchange section 144 in the Y direction presses against a side wall surface of upright section 147, and in that state exchange section 144 is attached to main body section 143 with bolts. Accordingly, exchange section 144 is attached to main body section 143 at a fixed specified position.

Also, fixed section 120, similar to movable section 122, is configured from main body section 148 configuring a lower portion of fixed section 120 and exchange section 149 configuring an upper portion of fixed section 120, and exchange section 149 is removably attached to main body section 148 via bolts. Further, first insertion hole 130 is formed in exchange section 149, and multiple types of exchange sections 149 are prepared with first insertion holes 130 with different sized diameters. Thus, with fixed section 120 too, an appropriate exchange section 149 is attached to main body section 148 in accordance with the lead diameter of the leaded component 106 that is the work target. With fixed section 120 too, when exchange section 149 is attached to main body section 148, exchange section 149 is attached to main body section 148 by bolts with a specified wall surface of exchange section 149 contacting a specified wall surface of main body section 148; because the configuration is similar to that of movable section 122, descriptions are omitted.

Also, as shown in FIG. 3, unit moving device 102 includes X-direction moving device 150, Y-direction moving device 152, Z-direction moving device 154, and rotation device 156. X-direction moving device 150 includes slide rail 160 and X slider 162. Slide rail 160 extends in the X direction, and X slider 162 is slidably supported on X slide rail 160. X slider 162 moves in the X direction by the driving of electromagnetic motor 164 (refer to FIG. 6). Y-direction moving device 152 includes slide rail 166 and Y slider 168. Slide rail 166 is arranged on X slider 162 extending in the Y direction, and Y slider 168 is slidably supported on slide rail 166. Y slider 168 moves in the Y direction by the driving of electromagnetic motor 170 (refer to FIG. 8). Z-direction moving device 154 includes slide rail 172 and Z slider 174. Slide rail 172 is arranged on Y slider 168 extending in the Z direction, and Z slider 174 is slidably supported on slide rail 172. Z slider 174 moves in the Z direction by the driving of electromagnetic motor 176 (refer to FIG. 8).

Further, rotation device 156 includes rotating table 178 that is roughly disc-shaped. Rotating table 178 is supported by Z slider 174 so as to be rotatable around its own center, and is rotated by the driving of electromagnetic motor 180 (refer to FIG. 8). Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotation device 156. Thus, second insertion hole 136 of cut and clinch unit 100 can be positioned at any position under circuit board 12 held by clamp device 52.

Figure 8:
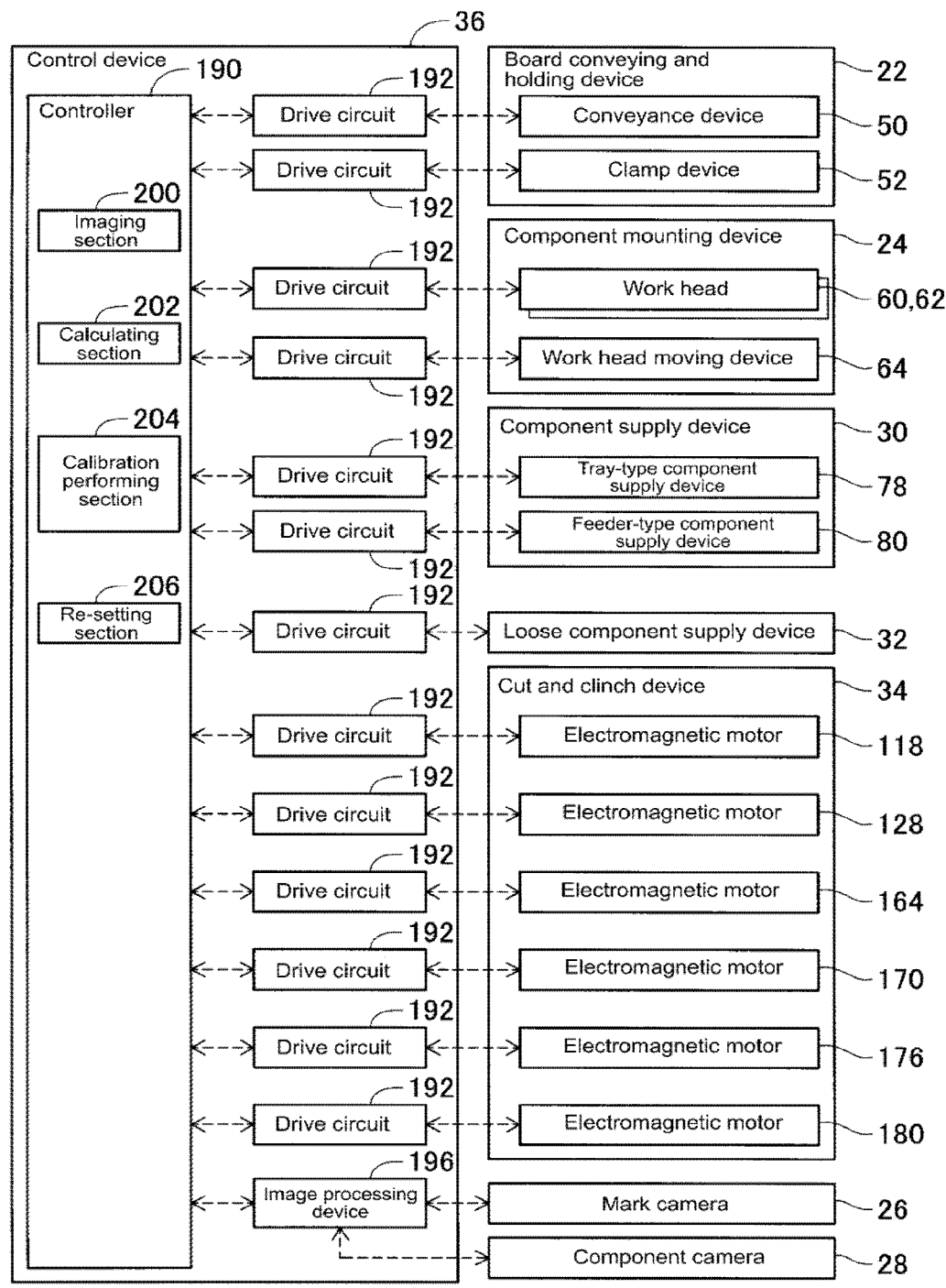
FIG. 8 is a block diagram showing a control device.

As shown in FIG. 8, control device 36 is provided with controller 190, multiple drive circuits 192, and image processing device 196. The multiple drive circuits 192 are connected to conveyance device 50, clamp device 52, work heads 60 and 62, work head moving device 64, tray type component supply device 78, feeder type component supply device 80, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Further, controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which leaded components 106 is mounted on circuit board 12.

Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies leaded components 106 at a specified supply position. One of the work heads 60 or 62 moves above the component supply position and picks up and holds component main body section 180 of a leaded component 106 (refer to FIG. 9) using suction nozzle 66.

Continuing, the work head 60 or 62 holding the leaded component 106 moves above component camera 28, and the leaded component 106 held by the suction nozzle 66 is imaged by component camera 28. Accordingly, information related to the holding position of the component is obtained. Continuing, work head 60 or 62 holding leaded component 106 moves above circuit board 12, and corrects the error in the holding position of circuit board 12 and the error in the holding position of the component and so on. Then, leads 108 of leaded component 106 held by suction nozzle 66 are inserted into through-holes 104 formed in circuit board 12. Here, cut and clinch unit 100 is moved below circuit board 12.

Specifically, with cut and clinch unit 100, the distance between the pair of slide bodies 112 is adjusted by pitch changing mechanism 114 such that the distance between the pair of second insertion holes 136 of movable section 122 of slide body 112 is the same as the distance between the two through-holes 104 formed in circuit board 12. Also, cut and clinch unit 100 is moved by operation of X-direction moving device 150 and Y-direction moving device 152 such that the coordinates in the XY directions of the second insertion holes 136 of slide bodies 112 are aligned with the coordinates in the XY directions of the through-holes 104 of circuit board 12. Thus, by cut and clinch unit 100 moving in the XY directions, second insertion holes 136 of slide body 112 and through-holes 104 of circuit board 12 are positioned overlapping in the vertical direction.

Next, cut and clinch unit 100 is raised by operation of Z-direction moving device 154 such that the upper surface of movable section 122 contacts the lower surface of circuit board 12 or is positioned slightly below the lower surface of circuit board 12. In this manner, by controlling operation of X-direction moving device 150, Y-direction moving device 152, and Z-direction moving device 154 cut and clinch unit 100 is arranged below circuit board in a state with the second insertion holes 136 of slide body 112 overlapping with through-holes 104 of circuit board 12.

Figure 9:
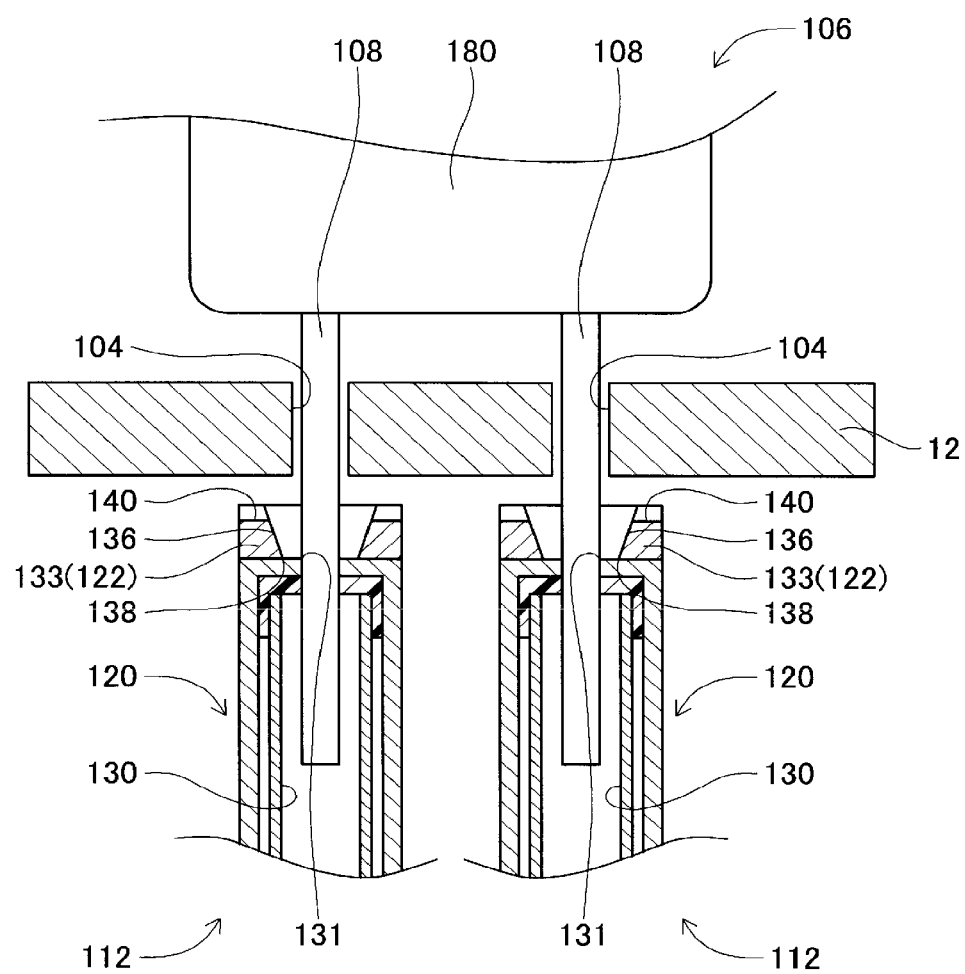
FIG. 9 is a schematic view of a cut and clinch unit immediately before a lead of a leaded component is cut.
Figure 10:
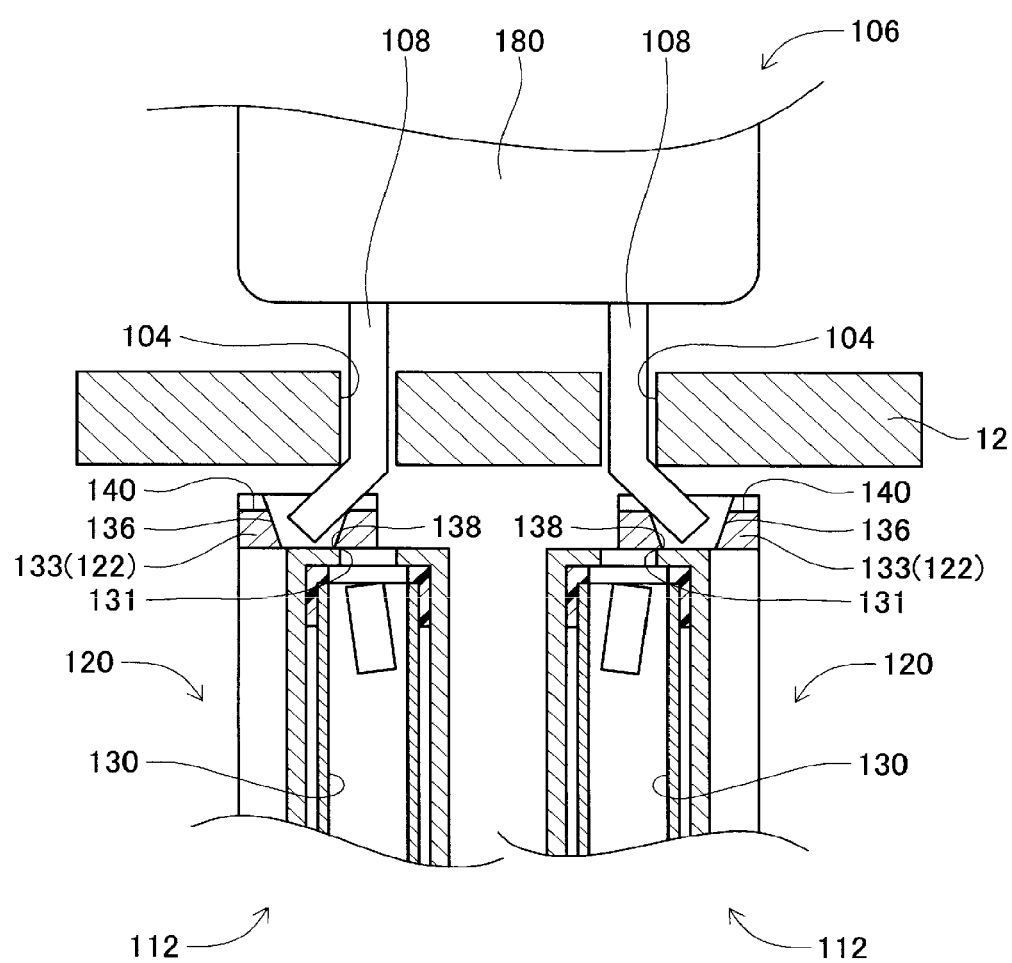
FIG. 10 is a schematic view of a cut and clinch unit after a lead of a leaded component has been cut.

Then, when leads 108 of leaded component 106 held by suction nozzle 66 are inserted into through-holes 104 of circuit board 12, as shown in FIG. 9, the end section of leads 108 is inserted into first insertion hole 130 of fixed section 120 through second insertion hole 136 of movable section 122 of cut and clinch unit 100. Next, when the tip section of lead 108 has been inserted into first insertion hole 130 of fixed section 120, movable section 122 is slid by operation of slide device 124. Thus, as shown in FIG. 10, lead 108 is cut by fixed blade 131 of first insertion hole 130 and movable blade 138 of second insertion hole 136. Then, the tip section separated by the cutting of lead 108 falls through first insertion hole 130 and is discarded in discard box 132. Also, the new tip section formed by the cutting of lead 108 is bent along the tapered surface of the inside of second insertion hole 136 in accordance with the sliding of movable section 122, and the tip section of lead 108 is bent along guide groove 140 by the further sliding of movable section 122. Thus, leaded component 106 is mounted into circuit board 12 in a state in which leads 108 are prevented from coming out of through-holes 104.

In this manner, with component mounter 10, leaded component 106 is mounted into circuit board 12 by lead 108 being cut and bent by cut and clinch device 34. However, second insertion hole 136 into which lead 108 is inserted during cutting and bending by cut and clinch device 34 is relatively small. Therefore, to insert lead 108 appropriately into second insertion hole 136, it is necessary to perform calibration to appropriately recognize the opening position of second insertion hole 136.

In particular, with cut and clinch unit 100, exchange section 144 of movable section 1222 in which second insertion hole 136 is formed, and exchange section 144 of fixed section 120 in which first insertion hole 130 is formed are removably attached to main body sections 143 and 148 respectively, with exchange sections 144 and 149 being exchanged in accordance with the lead diameter of the leaded component 106 that is the work target. When exchange sections 144 and 149 are exchanged, as described above, exchange sections 144 and 149 are attached to main body sections 143 and 148 by bolts with a specified wall surface of exchange sections 144 and 149 contacting a specified wall surface of main body sections 143 and 148. Thus, exchange sections 144 and 149 are attached to main body sections 143 and 148 at a fixed specified position; however, a slight deviation arises in the specified position of exchange sections 144 and 149 due to factors such as the bolts being tightened. Therefore, after exchanging exchange section 144 or 149, calibration must be performed with respect to the opening position of second insertion hole 136.

Therefore, with a conventional component mounter, an operation button for performing calibration is provided, and an operator operates the operation button after exchange of exchange section 144 and 149 has been performed, thereby performing calibration with respect to the opening position of second insertion hole 136. However, human error means that sometimes an operator may forget to press the operation button, such that calibration is not performed. In such a case, it may not be possible to appropriately insert lead 108 into second insertion hole 136, and mounting work of leaded component 106 may not be performed appropriately.

One might consider performing calibration with respect to the opening position of second insertion hole 136 at predetermined timing without the need for pressing the operation button, for example, when starting mounting work, when component mounter 10 is booted up, or at a specified time interval. This would ensure that calibration is performed at predetermined times and prevent human calibration from being forgotten due to human error. However, because calibration takes a relatively long time to perform, for example, if calibration is performed whenever starting mounting work, productivity will drop.

Considering this, with component mounter 10, it is determined whether exchange section 144 has been exchanged based on image data of second insertion hole 136, and in a case in which it is determined that exchange section 144 has been exchanged, calibration is performed with respect to the opening position of second insertion hole 136. In detail, at a predetermined timing, cut and clinch unit 100 is moved to a specified position, and at that position curved section 133 of movable section 122 of cut and clinch unit 100 is imaged by mark camera 26. Then, the image data is sent to controller 190, and in controller 190, based on the image data, pair of marks 142 provided on curved section 133 are recognized. The pair of marks 142 are provided centered around the center of the opening of second insertion hole 136. That is, the center point of the pair of marks 142 is the center of the opening of second insertion hole 136. Thus, by recognizing the position of the pair of marks 142 based on the image data in controller 190, the center point of the pair of marks 142 is calculated as the opening position of second insertion hole 136.

Also, controller 190 memorizes the standard position of second insertion hole 136. The standard position of second insertion hole 136 is the opening position of second insertion hole 136 when exchange section 144 is positioned at a specified position of main body section 143 when cut and clinch unit 100 has been moved to a specified position. Therefore, the calculated opening position of second insertion hole 136 (also referred to as "calculated position") is compared to the standard position of second insertion hole 136, and it is determined whether the difference between the calculated position of second insertion hole 136 and the standard position of second insertion hole 136 exceeds a predetermined threshold value. If the difference between the calculated position of second insertion hole 136 and the standard position of second insertion hole 136 is equal to or less than a predetermined threshold value, it can be assumed that exchange section 144 has not been exchanged. Therefore, calibration is not performed with respect to the opening position of second insertion hole 136.

Conversely, if the difference between the calculated position of second insertion hole 136 and the standard position of second insertion hole 136 exceeds the predetermined threshold value, it can be assumed that exchange section 144 has been exchanged. Therefore, calibration is performed with respect to the opening position of second insertion hole 136 based on the calculated position of second insertion hole 136. In this manner, at a predetermined interval, it is determined whether exchange section 144 has been exchanged, and by performing calibration when it is determined that exchange section 144 has been exchanged, it is possible to perform calibration only when necessary. Thus, mounting work of leaded component 106 is performed reliably due to performing calibration, and drops in productivity due to unnecessary calibration are avoided.

Also, with component mounter 10, it is determined whether exchange section 144 has been exchanged based on image data captured by mark camera 26. That is, it is determined whether exchange section 144 has been exchanged using existing equipment, and it is not necessary to provide sensors or the like for determining whether exchange section 144 has been exchanged. This prevents an increase in equipment costs.

Also, in a case in which the difference between the calculated position of second insertion hole 136 and the standard position of second insertion hole 136 exceeds the predetermined threshold value, the calculated position of second insertion hole 136 is memorized as the standard position of second insertion hole 136. That is, the calculated position of second insertion hole 136 is re-set as the standard position of second insertion hole 136. Thus, the standard position of second insertion hole 136 is updated each time calibration is performed, enabling appropriate determining as to whether exchange section 144 has been exchanged.

Note that, as shown in FIG. 8, controller 190 includes imaging section 200, calculating section 202, calibration performing section 204, and re-setting section 206. Imaging section 200 is a functional section for imaging curved section 133 of movable section 122 using mark camera 26. Calculating section 202 is a functional section for calculating the calculated position of second insertion hole 136 based on the image data. Calibration performing section 204 is a functional section for performing calibration when the difference between the calculated position of second insertion hole 136 and the standard position of second insertion hole 136 exceeds the predetermined threshold value. Re-setting section 206 is a functional section for re-setting the calculated position as the standard position when the difference between the calculated position of second insertion hole 136 and the standard position of second insertion hole 136 exceeds the predetermined threshold value.

Component mounter 10 is an example of a substrate working machine. Mark camera 26 is an example of an imaging device. Cut and clinch device 34 is an example of a bending device. Control device 36 is an example of a recognition device. First insertion hole 130 is an example of an insertion hole. Second insertion hole 136 is an example of a through-hole. Mark 142 is an example of an imaging target. Main body section 143 is an example of a main body section. Exchange section 144 is an example of a contacting section and a movable section. Protruding section 145 is an example of a side surface. Level difference section 146 is an example of a pressing surface. Upright section 147 is an example of a pressure surface. Main body section 148 is an example of a main body section. Exchange section 149 is an example of a contacting section and a fixed section. Imaging section 200 is an example of an imaging section. Calculating section 202 is an example of a calculating section. Calibration performing section 204 is an example of a calibration performing section. Re-setting section 206 is an example of a re-setting section. An opening position of second insertion hole 136 is an example of an attachment position of a contacting section on a main body section.

Further, the present disclosure is not limited to the above example embodiments, and various changed or improved methods of embodiment are possible based on the knowledge of someone skilled in the art. Specifically, for example, in an embodiment above, marks 142 are provided on curved section 133 of movable section 122, and the opening position of second insertion hole 136 is calculated based on marks 142; however, the attachment position of exchange section 144 on main body section 143 may also be calculated based on marks 142. Also, the opening position of second insertion hole 136 or the like may be calculated based on the image data of second insertion hole 136 without marks 142 being provided on curved section 133.

Further, the present disclosure is applied to a device that cuts and bends lead 108 that is inserted into first insertion hole 130 and second insertion hole 136, but the present disclosure may be applied to, for example, a device that cuts and bends lead 108 by sandwiching lead 108 using multiple members. In such a case, calibration is performed with respect to the positions of those multiple members. Also, the present disclosure may be applied to a device that bends lead 108 by contacting a specified member against lead 108. That is, the present disclosure may be applied to a device that bends leads 108 without cutting leads 108. In this case, calibration is performed with respect to the position of the specified member.

REFERENCE SIGNS LIST

10: component mounter (substrate working machine);
26: mark camera (imaging device);
34: cut and clinch device (bending device);
36: control device;
130: first insertion hole (hole section);
136: second insertion hold (through-hole)
142: mark (imaged object);
143: main body section;
144: exchange section (contacting section) (movable section);
145: protruding section (wall surface);
146: level difference section (pressing surface);
147: upright section (pressing surface);
148: main body section;
149: exchange section (contacting section) (fixed section);
200: imaging section;
202: calculating section;
204: calibration performing section;
206: re-setting section

The invention claimed is:

1. A substrate working machine comprising:
a bending device configured to bend a lead of a leaded component inserted into a through-hole formed in a board;
an imaging device; and
a control device,
wherein
the bending device includes a contacting section configured to bend the lead via contact with the lead, and a main body section to which the contacting section is removably attached, and
the control device includes
an imaging section configured to use the imaging device to capture an image of a predetermined imaging target of the contacting section,
a calculating section configured to calculate position information that is information related to an attachment position of the contacting section on the main body section based on imaging data captured by the imaging section, and
a calibration performing section configured to perform calibration related to the attachment position of the contacting section to the main body section in a case in which a difference between position information calculated by the calculating section and set position information that is set in advance exceeds a threshold value.

2. The substrate working machine according to claim 1, wherein
the control device further includes a resetting section configured to reset the position information calculated by the calculated by the calculating section as the set position information in a case in which the difference between the position information calculated by the calculating section and the set position information that is set in advance exceeds the threshold value.

3. The substrate working machine according to claim 1, wherein
the contacting section includes a through-hole into which the lead is inserted, and
the lead is bent by the contacting section sliding in a state with the lead inserted into the through-hole.

4. The substrate working machine according to claim 3, wherein
the contacting section is provided with
a fixed section on which is formed a hole section, and
a movable section that is slidable with respect to the fixed section and on which the through-hole is formed to overlap with the hole section when viewed from above, wherein
the lead is inserted into the hole section and the through-hole with the hole section and the through-hole in an overlapping state, and by the movable section sliding, the lead is cut and bent.

5. The substrate working machine according to claim 4, wherein
the imaging target is formed on the movable section.

6. The substrate working machine according to claim 1, wherein
the main body section includes a pressing surface for pressing a specified wall surface of the contacting section, and
the contacting section is attached to the main body section in a state with the pressing surface pressing the wall surface.

* * * * *